United States Patent [19]

Morita

[11] Patent Number: 5,008,891
[45] Date of Patent: Apr. 16, 1991

[54] SEMICONDUCTOR LIGHT-EMITTING DEVICES

[75] Inventor: Yoshio Morita, Osaka, Japan
[73] Assignee: Matsushita Electric Industrial Co., Ltd., Japan
[21] Appl. No.: 507,273
[22] Filed: Apr. 10, 1990

[30] Foreign Application Priority Data

Apr. 11, 1989 [JP] Japan .................................. 1-91325

[51] Int. Cl.$^5$ ................................................ H01S 3/19
[52] U.S. Cl. ........................................ 372/45; 357/17
[58] Field of Search ................... 372/45, 43; 357/17, 357/16

[56] References Cited

U.S. PATENT DOCUMENTS 4,868,615 9/1989 Kamata ................................ 357/17

FOREIGN PATENT DOCUMENTS 0164382 8/1985 Japan .................................. 372/43
0288088 11/1988 Japan .................................. 372/45

OTHER PUBLICATIONS

Sigurd Wagner, "Preparation and Properties of Green–Light–Emitting CdS–CuGaS$_2$ Heterodiodes", *Journal of Applied Physics*, vol. 45, No. 1, Jan. 1984, pp. 246–251.

*Primary Examiner*—Georgia Epps
*Attorney, Agent, or Firm*—Lowe, Price, Leblanc, Becker & Shur

[57] ABSTRACT

Configurations of heterostructure semiconductor lasers and LEDs are desribed which enable emission wavelengths in the blue to ultra-violet region to be achieved. The structures are based on an n-type layer formed of a (ZnCd)(SSe) II-VI semiconductor and a p-type layer formed of Cu(AlGa)(SSe)$_2$ or (ZnCd)Ga$_2$(SSe)$_4$ semiconductor, epitaxially formed successively on a substrate, with each layer having an identical value of lattice constant to that of the substrate.

16 Claims, 1 Drawing Sheet

SEMICONDUCTOR LIGHT-EMITTING DEVICES

BACKGROUND OF THE INVENTION

1. Field of Application

The present invention relates to semiconductor light-emitting devices such as semiconductor lasers, light-emitting diodes, etc, and in particular relates to semiconductor light-emitting devices having emission wavelengths in a range which includes the blue to ultra-violet region of the spectrum.

2. Prior Art Technology

In recent years semiconductor lasers have been realized in practice, which utilize AlGaAs/GaAs III–V semiconductor materials. When a semiconductor laser is used in a data processing application such as data readout from an optical disc, or in a laser printer, it is desirable that the emission wavelength of the light produced from the semiconductor laser be as short as possible, in order to maximize the data processing performance. However with semiconductor lasers that have been utilized hitherto, even if the activation layer of the laser is formed of a material such as AlGaInP, which has a large size of forbidden energy gap and is among the direct-transition type III–V semiconductor materials, it is only possible to achieve an emission wavelength that is in the range 580 to 690 nm. Thus, the emission wavelength cannot be made sufficiently short to reach the blue region of the visible spectrum. Another direct-transition type compound semiconductor material which has an even larger value of forbidden energy gap is Zn(SSe), which is a II–VI compound semiconductor. However due to the difficulty encountered in controlling p-type conduction in this material, it has not been possible to utilize it to obtain emission in the blue to ultra-violet region of the spectrum.

A similar problem arises with light-emitting diodes. Red light-emitting diodes (LEDs) which employ AlGaAs and green LEDs utilizing GaP are now widely utilized as display devices. However there is a need for a capability for practical manufacture of blue-emission LEDs, in order to increase the number of colors which can be used in such display applications. This has not been possible up to the present.

SUMMARY OF THE INVENTION

It is an objective of the present invention to overcome the disadvantages of the prior art as set out above, by providing semiconductor light-emitting devices capable of emission wavelengths in the range extending from the blue to the ultra-violet regions of the spectrum.

In order to achieve this objective, a semiconductor light-emitting device according to the present invention has a structure that is based on an n-type semiconductor layer formed of a (ZnCd)(SSe) compound, and a p-type layer formed of a $Cu(AlGa)(SSe)_2$ or $(ZnCd)Ga_2(SSe)_4$ compound, epitaxially formed successively on a substrate, with each layer having an identical value of lattice constant to that of the substrate. In the case of a semiconductor laser, an activation layer formed of a $Cu(AlGa)(SSe)_2$ type of compound is sandwiched between the p-type and n-type layers.

More specifically, according to a first aspect, a semiconductor light-emitting device according to the present invention, constituting a semiconductor laser, comprises a substrate and a combination of semiconductor layers disposed on the substrate in a double heterostructure laser configuration, the layers comprising:

a p-type semiconductor cladding layer formed of $Cu(Al_aGa_{1-a})(S_bSe_{1-b})_2$ where $0 \leq a \leq 1$ and $0 \leq b \leq 1$;

an n-type semiconductor cladding layer formed of $(Zn_cCd_{1-c})(S_dSe_{1-d})$, where $0 \leq c \leq 1$ and $0 \leq d \leq 1$; and an activation layer disposed between the n-type cladding layer and p-type cladding layer and formed of $Cu(Al_aGa_{1-a})(S_bSe_{1-b})_2$;

each of the p-type cladding layer, n-type cladding layer and activation layer having an identical value of lattice constant to that of the substrate.

According to a second aspect, a semiconductor light-emitting device according to the present invention, constituting a light-emitting diode, comprises a substrate and a p-type semiconductor layer and n-type semiconductor layer formed as successive layers on the substrate, the p-type semiconductor layer being formed of $Cu(Al_aGa_{1-a})(S_bSe_{1-b})_2$ where $0 \leq a \leq 1$ and $0 \leq b \leq 1$, and the n-type semiconductor layer being formed of $(Zn_cCd_{1-c})(S_dSe_{1-d})$, where $0 \leq c \leq 1$ and $0 \leq d \leq 1$, with each of the p-type and n-type layers having an identical value of lattice constant to that of the substrate.

DESCRIPTION OF PREFERRED EMBODIMENTS

Figure 1:
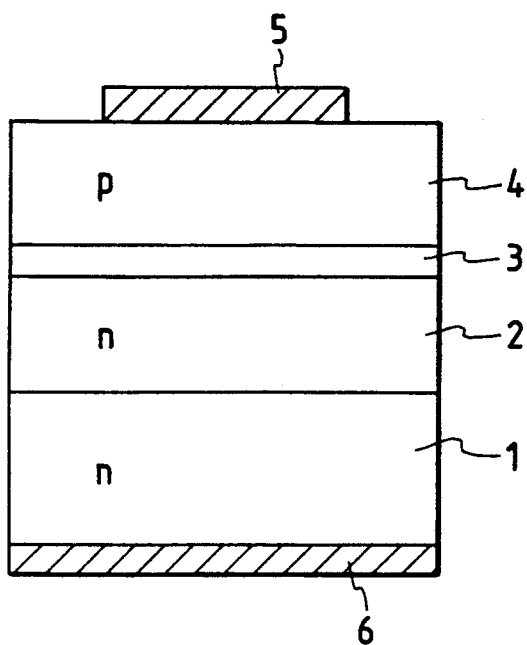
FIG. 1 is a cross-sectional view showing the general configuration of a first embodiment of a semiconductor light-emitting device according to the present invention, which is a semiconductor laser.

FIG. 1 is a cross-sectional view of a first embodiment of the present invention, which is a semiconductor laser. Numeral 1 denotes a substrate which is formed of n-type GaP semiconductor, on which is a layer 2 of $Zn(S_{0.85}Se_{0.15})$ n-type semiconductor which has been formed by epitaxial growth, as an n-type semiconductor cladding layer. The n-type cladding layer 2 has an identical value of lattice constant to GaP, i.e. 5.449 Å, and has a forbidden energy gap of approximately 3.6 eV. Numeral 3 denotes an activation layer of $Cu(Al_{0.78}Ga_{0.22})(S_{0.58}Se_{0.42})_2$ which has been formed on the cladding layer 2 by epitaxial growth, and which also has an identical value of lattice constant to that of GaP. Numeral 4 denotes a cladding layer of p-type $CuAl(S_{0.58}Se_{0.42})_2$, which has been formed on the activation layer 3 by epitaxial growth. The cladding layer 4 also has an identical value of lattice constant to that of GaP, i.e. 5.449 Å, and has a forbidden energy gap of approximately 3.1 eV. Numeral 5 denotes an In-Ga electrode, which is a p-type electrode that is formed on the opposite side of the cladding layer 4 from the activation layer 3, and 6 denotes an Au-Si electrode which is an n-type electrode that is formed on the opposite side of the substrate 1 from the cladding layer 2.

The difference between the forbidden energy gap of the activation layer 3 (designated as Eg1) and the forbidden energy gap of the p-type cladding layer 4 (designated as Eg2) is approximately 200 meV (where Eg1 < Eg2). This is sufficient to achieve laser emission, and an emission wavelength of approximately 420 nm is obtained with the above configuration. Due to the fact that each of the n-type cladding layer 2, p-type cladding layer 4 and the activation layer 3 has a value of lattice constant that is identical to that of GaP, such a double heterostructure configuration is highly resistant to element deterioration, and provides a very high quality semiconductor laser.

A semiconductor laser of the form described above has been manufactured, by using the MOCVD (metal organic chemical vapor deposition) technique. The MOCVD method provides a very high degree of control of formation of the device, and enables high-grade semiconductor epitaxial crystal layers to be formed. The n-type cladding layer 2 is rendered n-type by using Cl as a dopant, while the p-type cladding layer 4 is rendered p-type by using N as a dopant. The Au-Si electrode constitutes an ohmic contact electrode on the n-type substrate 1, while the In-Ga electrode constitutes an ohmic contact electrode on the p-type cladding layer 4.

With this embodiment, since an n-type substrate is utilized, the semiconductor layers extend from the substrate successively in the sequence n-type layer 2, activation layer 3, p-type layer 4. However if a p-type substrate were to be used, then of course the layers of the device would be successively arranged extending from the substrate in the sequence p-type cladding layer, activation layer, n-type cladding layer.

It has been found that when a current is passed through a semiconductor laser having the above configuration, a high level of output power is achieved, together with a long operating life, and an emission wavelength of 420 nm.

As an alternative to using the MOCDV method for manufacturing such a semiconductor laser, it would be equally possible to use the MBE (molecular beam epitaxy) method, which also provides a very high quality of crystal structure and precise control of formation of the layers.

Figure 2:
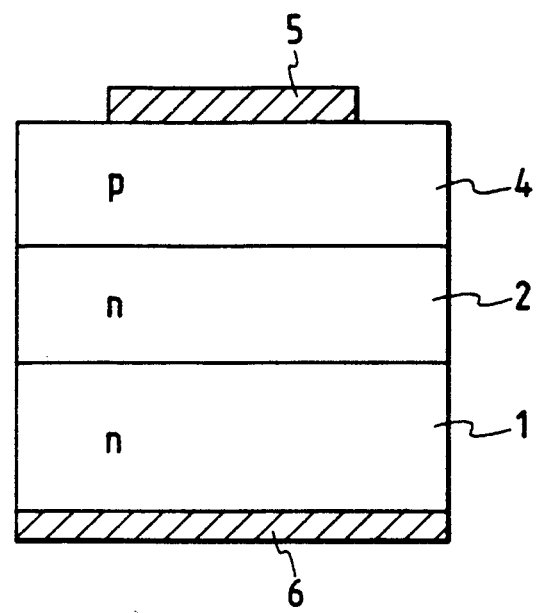
FIG. 2 is a cross-sectional view showing the general configuration of a second embodiment of a semiconductor light-emitting device according to the present invention, which is a LED.

FIG. 2 is a cross-sectional view of a second embodiment of a semiconductor light-emitting device according to the present invention, which in this case is a light-emitting diode. Numeral 1 denotes a substrate formed of n-type GaP semiconductor, on which is a layer 2 of $Zn(S_{0.85}Se_{0.15})$ n-type semiconductor which has been formed by epitaxial growth. A layer 4 of p-type $CuAl(S_{0.58}Se_{0.42})_2$ is formed upon the layer 2, by epitaxial growth. Numeral 5 denotes an In-Ga electrode, which is a p-type electrode that is formed on the opposite side of the p-type layer 4 from the n-type layer 2, and 6 denotes an Au-Si electrode which is an n-type electrode that is formed on the opposite side of the substrate 1 from the n-type layer 2. The forbidden energy gap of the n-type layer 2 is approximately 3.6 eV, and the forbidden energy gap of the p-type layer 4 is approximately 3.1 eV. Each of the layers 2 and 4 has an identical value of lattice constant to that of GaP, i.e. 5.449 Å.

The above configuration provides a blue-light-emitting diode, having an emission wavelength of 400 nm. Such an LED has been manufactured using the MBE process. The $Zn(S_{0.85}Se_{0.15})$ layer 2 was formed, as for the first embodiment described above, using Ga as the n-type dopant, while P was used as a p-type dopant for the $CuAl(S_{0.58}Se_{0.42})_2$ layer 4. From evaluation of such a LED manufactured by the MBE method, it has been found that a blue-emission LED is obtained which has a long operating life and a high level of output power.

Figure 3:
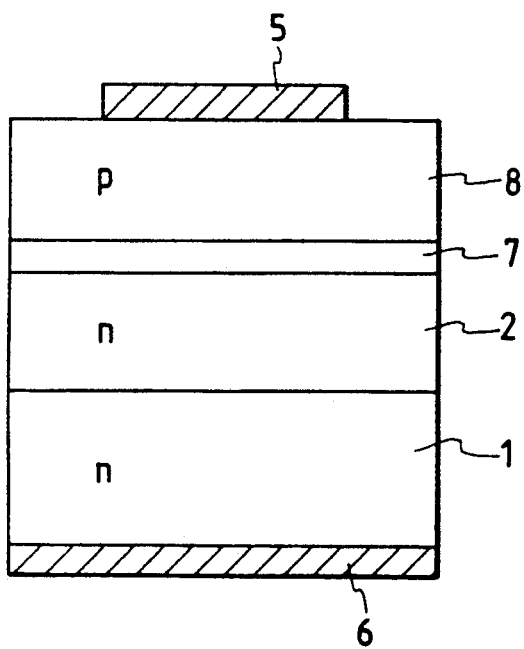
FIG. 3 is a cross-sectional view showing the general configuration of a third embodiment of a semiconductor light-emitting device according to the present invention, which is a semiconductor laser.

FIG. 3 is a cross-sectional view of a third embodiment of the present invention, which is a semiconductor laser. Numeral 1 denotes a substrate which is formed of n-type GaP, on which is a layer 2 of $Zn(S_{0.85}Se_{0.15})$ n-type semiconductor, formed by epitaxial growth as an n-type cladding layer. As for the first embodiment described above, the n-type cladding layer 2 has an identical value of lattice constant to GaP, i.e. 5.449 Å, and has a forbidden energy gap of approximately 3.6 eV. Numeral 7 denotes an activation layer of $(Zn_{0.50}Cd_{0.50})Ga_2(S_{0.86}Se_{0.14})_4$ which has been formed on the cladding layer 2 by epitaxial growth, and which also has an identical value of lattice constant to that of GaP. Numeral 8 denotes a cladding layer of p-type $(Zn_{0.40}Cd_{0.60})Ga_2S_4$ which has been formed on the activation layer 7 by epitaxial growth. The cladding layer 8 also has an identical value of lattice constant to that of GaP, and has a forbidden energy gap of approximately 3.4 eV. Numeral 5 denotes an In-Ga electrode, which is a p-type electrode that is formed on the opposite side of the cladding layer 8 from the activation layer 7, and 6 denotes an Au-Si electrode which is an n-type electrode that is formed on the opposite side of the substrate 1 from the cladding layer 2.

With this embodiment, the difference between the forbidden energy gap of the activation layer 7 (designated as Eg1) and the forbidden energy gap of the p-type cladding layer 8 (designated as Eg2) is approximately 200 meV (where Eg1 < Eg2). This is sufficient to achieve laser emission, and an emission wavelength of approximately 380 nm is obtained. Due to the fact that each of the n-type cladding layer 2, p-type cladding layer 8 and the activation layer 7 has an identical value of lattice constant to that of the GaP substrate 1, a high quality double heterostructure semiconductor laser can be produced which is highly resistant to element deterioration.

A semiconductor laser of the above configuration has been manufactured by the MOCVD technique, using Cl as a dopant for the n-type cladding layer 2 and N as a dopant for the p-type cladding layer 8. The Au-Si electrode constitutes an ohmic contact electrode on the n-type substrate 1, while the In-Ga electrode constitutes an ohmic contact electrode on the p-type cladding layer 8.

It has been found that when a current is passed through a semiconductor laser having the above configuration, a high level of output power is achieved, together with a long operating life. An emission wavelength of 380 nm is obtained.

As for the first embodiment, as an alternative to using the MOCDV method for manufacturing such a semiconductor laser, it would be equally possible to use the MBE (molecular beam epitaxy) method.

Figure 4:
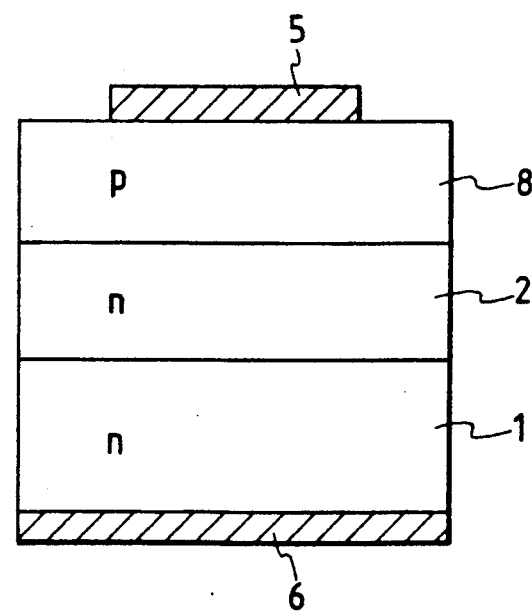
FIG. 4 is a cross-sectional view showing the general configuration of a fourth embodiment of a semiconductor light-emitting device according to the present invention, which is a LED.

FIG. 4 is a cross-sectional view of a fourth embodiment of a semiconductor light-emitting device according to the present invention, which is a light-emitting diode. Numeral 1 denotes a substrate formed of n-type GaP, on which is formed a layer 2 of $Zn(S_{0.85}Se_{0.15})$ n-type semiconductor which has been formed by epitaxial growth. A layer of p-type $(Zn_{0.40}Cd_{0.60})Ga_2S_4$ is formed upon the layer 2, by epitaxial growth. Numeral 5 denotes an In-Ga electrode, which is a p-type electrode that is formed on the opposite side of the p-type layer 8 from the n-type layer 2, and 6 denotes an Au-Si electrode which is an n-type electrode that is formed on the opposite side of the substrate 1 from the n-type layer 2. The forbidden energy gap of the n-type layer 2 is approximately 3.6 eV, and the forbidden energy gap of the p-type layer 8 is approximately 3.4 eV. Each of the layers 2 and 8 has an identical value of lattice constant to that of the GaP substrate 1.

The above configuration provides an ultra-violet-light-emitting diode, with an emission wavelength of 370 nm. As for the embodiment of FIG. 2, such an LED can be manufactured by the MBE process.

From evaluation of such a device manufactured by the MBE method, it has been found that an ultra-violet-emission LED is obtained which has a long operating life and a high level of output power.

Although in the first and second of the above embodiments, the p-type layer 4 is formed of $Cu Al(S_{0.58}Se_{0.42})_2$, these values are for use with a substrate that is formed of GaP. If another material is used to form the substrate, then it may be necessary to use Ga in place of Al, or a combination of Ga and Al, and also vary the proportions of S and Se, in order to ensure that the lattice constant of the p-type layer 4 is identical to that of the substrate material. In general, the layer 4 is formed of $Cu(Al_aGa_{1-a})(S_bSe_{1-b})_2$ where $0 \leq a \leq 1$ and $0 \leq b \leq 1$.

Similarly, although in the third and fourth of the above embodiments, the p-type layer 8 is formed as a compound $(Zn_{0.40}Cd_{0.60})Ga_2S_4$ may be necessary to use other proportions of Zn, and Cd, and to use Se in place of S, or a combination of S and Se, if a material other than GaP is used for the substrate. In general, the layer 8 is formed of $(Zn_aCd_{1-a})Ga_2(S_bSe_{1-b})_4$, where $0 \leq a \leq 1$ and $0 \leq b \leq 1$.

In a similar way, although in each of the above embodiments the n-type layer 2 is formed of $Zn(S_{0.85}Se_{0.15})$, it may be necessary to utilize Cd in place of Zn, or a combination of Zn and Cd in that compound, as well as different proportions of S and Se, if a substrate material other than GaP is used. In general, the n-type semiconductor layer 2 is formed of $(Zn_cCd_{1-c})(S_dSe_{1-d})$, where $0 \leq c \leq 1$ and $0 \leq d \leq 1$.

Although the present invention has been described in the above referring to four specific embodiments, it should be noted that the scope of the invention is not limited to these embodiments. As mentioned above, the invention is not limited to devices in which the substrate is formed of GaP, and it is equally possible to utilize certain other materials. In the case of the first and second embodiments, it is only necessary that the lattice constant of the substrate material have a value that is smaller than the lattice constant of $CuAlSe_2$ and greater than the lattice constant of ZnS. In the case of the third and fourth embodiments, it is necessary that the lattice constant of the substrate material have a value that is smaller than the lattice constant of $CdGa_2Se_4$ and greater than the lattice constant of ZnS.

If a substrate material is used which has a lattice constant that is different from that of GaP, for example if Si is used, then as described above it is necessary to adjust the relative proportions of the materials constituting the layers from the proportions which have been described above for the respective embodiments, to ensure that the basic condition of the present invention is satisfied whereby each of the layers has an identical value of lattice constant to that of the substrate.

Furthermore although in each of the above embodiments, one of the semiconductor layers is epitaxially formed directly on a substrate, it would be equally possible to form a buffer layer between the first semiconductor layer and the substrate.

Moreover it would also be possible to form such a device in a stripe pattern, to achieve current concentration (i.e. to form the electrodes as stripes, or the semiconductor layers).

It can be understood from the above that the present invention enables semiconductor light-emitting devices to be manufactured which provide emission wavelengths corresponding to the blue to ultra-violet region of the spectrum, which has not hitherto been possible.

What is claimed is:

1. A semiconductor light-emitting device comprising a substrate and a combination of semiconductor laser layers disposed on said substrate in a double heterostructure laser configuration, said layers comprising:
   a p-type semiconductor cladding layer formed of $Cu(Al_aGa_{1-a})(S_bSe_{1-b})_2$ where $0 \leq a \leq 1$ and $0 \leq b \leq 1$;
   an n-type semiconductor cladding layer formed of $(Zn_cCd_{1-c})(S_dSe_{1-d})$, where $0 \leq c \leq 1$ and $0 \leq d \leq 1$; and
   an activation layer disposed between said n-type cladding layer and p-type cladding layer and formed of $Cu(Al_aGa_{1-a})(S_bSe_{1-b})_2$;
   each of said p-type cladding layer, n-type cladding layer and activation layer having an identical value of lattice constant to that of said substrate.

2. A semiconductor light-emitting device according to claim 1, in which said substrate has one of said p-type and n-type cladding layers formed directly thereon, and is formed of a semiconductor material which is of identical conductivity type to said layer that is formed thereon.

3. A semiconductor light-emitting device according to claim 1, in which said substrate is formed of GaP or Si.

4. A semiconductor light-emitting device according to claim 2, in which said substrate is formed of GaP or Si.

5. A semiconductor light-emitting device comprising a substrate and a p-type semiconductor layer and n-type semiconductor layer formed as successive layers on said substrate, said p-type semiconductor layer being formed of $Cu(Al_aGa_{1-a})(S_bSe_{1-b})_2$ where $0 \leq a \leq 1$ and $0 \leq b \leq 1$, and said n-type semiconductor layer being formed of $(Zn_cCd_{1-c})(S_dSe_{1-d})$, where $0 \leq c \leq 1$ and $0 \leq d \leq 1$, with each of said p-type and n-type layers having an identical value of lattice constant to that of said substrate.

6. A semiconductor light-emitting device according to claim 5, in which said substrate has one of said p-type and n-type layers formed directly thereon, and is formed of a semiconductor material which is of identical conductivity type to said layer that is formed thereon.

7. A semiconductor light-emitting device according to claim 5, in which said substrate is formed of GaP or Si.

8. A semiconductor light-emitting device according to claim 6, in which said substrate is formed of GaP or Si.

9. A semiconductor light-emitting device comprising a substrate and a combination of successive semiconductor layers disposed on said substrate in a double heterostructure laser configuration, said layers comprising:

a p-type semiconductor cladding layer formed of $(Zn_aCd_{1-a})Ga_2(S_bSe_{1-b})_4$, where $0 \leq a \leq 1$ and $0 \leq b \leq 1$;

an n-type semiconductor cladding layer formed of $(Zn_cCd_{1-c})(S_dSe_{1-d})$, where $0 \leq c \leq 1$ and $0 \leq d \leq 1$; and an activation layer disposed between said n-type cladding layer and p-type cladding layer and formed of $(Zn_aCd_{1-a})Ga_2(S_bSe_{1-b})_4$;

each of said p-type cladding layer, n-type cladding layer and activation layer having an identical value of lattice constant to that of said substrate.

10. A semiconductor light-emitting device according to claim 9, in which said substrate has one of said p-type and n-type cladding layers formed directly thereon, and is formed of a semiconductor material which is of identical conductivity type to said layer that is formed thereon.

11. A semiconductor light-emitting device according to claim 9, in which said substrate is formed of GaP or Si.

12. A semiconductor light-emitting device according to claim 10, in which said substrate is formed of GaP or Si.

13. A semiconductor light-emitting device comprising a substrate and a p-type semiconductor layer and n-type semiconductor layer formed as successive layers on said substrate, said p-type semiconductor layer being formed of $(Zn_aCd_{1-a})Ga_2(S_bSe_{1-b})_4$, where $0 \leq a \leq 1$ and $0 \leq b \leq 1$, and said n-type semiconductor layer being formed of $(Zn_cCd_{1-c})(S_dSe_{1-d})$, where $0 \leq c \leq 1$ and $0 \leq d \leq 1$, with each of said p-type and n-type layers having an identical value of lattice constant to that of said substrate.

14. A semiconductor light-emitting device according to claim 13, in which said substrate has one of said p-type and n-type layers formed directly thereon, and is formed of a semiconductor material which is of identical conductivity type to said layer that is formed thereon.

15. A semiconductor light-emitting device according to claim 13, in which said substrate is formed of GaP or Si.

16. A semiconductor light-emitting device according to claim 14, in which said substrate is formed of GaP or Si.

* * * * *